(12) United States Patent
Kiba et al.

(10) Patent No.: US 6,217,657 B1
(45) Date of Patent: Apr. 17, 2001

(54) RESIST PROCESSING SYSTEM HAVING PROCESS SOLUTION DEAERATION MECHANISM

(75) Inventors: Yukio Kiba, Kikuyomachi; Norio Semba, Kumamoto; Keizo Hasebe, Kofu, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/175,963

(22) Filed: Oct. 21, 1998

Related U.S. Application Data (62) Division of application No. 08/927,418, filed on Sep. 11, 1997, now Pat. No. 5,866,307.

(30) Foreign Application Priority Data

Sep. 13, 1996 (JP) .................................................. 8-243492
Sep. 13, 1996 (JP) .................................................. 8-243493
Aug. 25, 1997 (JP) .................................................. 9-228217

(51) Int. Cl.[7] ................................................ B05C 5/02
(52) U.S. Cl. .................... 118/692; 118/693; 118/694; 118/712; 118/600; 118/610; 118/52; 118/56; 118/319; 118/320
(58) Field of Search .................................... 118/600, 610, 118/52, 56, 319, 320, 692–694, 712; 427/240, 356, 425

(56) References Cited

U.S. PATENT DOCUMENTS

| | | | |
|---|---|---|---|
| 5,374,312 | 12/1994 | Hasebe et al. | 396/611 |
| 5,405,443 | * 4/1995 | Akimoto et al. | 118/693 |
| 5,618,348 | * 4/1997 | Tran | 118/693 |

OTHER PUBLICATIONS

Patent Abstract of Japan, AN 96–331587, JP 8–153675, Jun. 11, 1996.
Patent Abstract of Japan, AN 96–005477, JP 7–283184, Oct. 27, 1995.

* cited by examiner

*Primary Examiner*—Laura Edwards
(74) *Attorney, Agent, or Firm*—Oblon, Spivak, McClelland, Maier & Neustadt, P.C.

(57) ABSTRACT

A resist processing system includes a sensor connected for detecting the surface level of the processing solution contained in an intermediate tank, and a controller connected for controlling the fluid pressure on the basis of the surface level detected by the sensor.

10 Claims, 7 Drawing Sheets

FIG. 16

RESIST PROCESSING SYSTEM HAVING PROCESS SOLUTION DEAERATION MECHANISM

This application is a Division of application Ser. No. 08/927,418 filed on Sep. 11, 1997, now U.S. Pat. No. 5,866,307.

BACKGROUND OF THE INVENTION

The present invention relates to a resist processing method for coating a resist on a substrate such as a semiconductor wafer and an LCD substrate, and developing the coated resist, and also relates to a resist processing system.

In the photolithographic process of a semiconductor device and a liquid crystal display device, a desired circuit pattern is formed by coating a resist on a semiconductor wafer and a substrate for a liquid crystal display (LCD), exposing the coated resist to light, and developing the exposed resist with a developing solution. In the developing process, a carrier gas (pressurized $N_2$ gas) is first introduced into a tank containing the developing solution. The developing solution is sent out from the tank by the gas pressure by way of a supply line to a nozzle. Finally, the developing solution is expelled from the nozzle onto the substrate.

In such a developing process, the developing solution must be uniformly supplied over the entire substrate surface in a short time to prevent non-uniform development. If the developing solution is supplied quickly from the tank to the nozzle by increasing the pressure of the carrier gas, a large quantity of the carrier gas dissolves in the developing solution, or ambient air gets involved into the developing solution which is supplied from the nozzle. As a result, air bubbles are readily formed in the developing solution supplied to the substrate. The air bubbles attach to a substrate surface, preventing the exposure of the coated resist to the developing solution. This is a cause of the defect, "undeveloped portion of a resist". To avoid this, a deaeration apparatus has been used to separate and remove a gaseous component from the developing solution before the solution is supplied to the substrate.

However, conventional methods for removing the gaseous component from the developing solution have problems. First, a liquid component acting as an active ingredient of the developing solution is removed together with the gaseous component. The amount of this liquid component cannot be negligible. As a result, the concentration of the developing solution changes, varying the quality of the developing process. Second, in the case of the developing-solution deaeration apparatuses conventionally used, when a vacuum evacuation line of the deaeration mechanism is contaminated with the liquid component (an active ingredient in the developing solution), the evacuation capacity of the deaeration mechanism decreases, lowering the evacuation rate. Furthermore, the vacuum evacuation line itself becomes contaminated with the liquid component.

BRIEF SUMMARY OF THE INVENTION

An object of the present invention is to provide a resist processing method capable of sufficiently removing a gaseous component from a processing solution such as a developing solution without changing the concentration of the processing solution. Another object of the present invention is to provide a resist processing system capable of efficiently removing a liquid component introduced into a vacuum evacuation line of a deaeration mechanism.

The resist processing method according to the present invention is a method for introducing a pressurized gas into a vessel storing a processing solution, sending the processing solution from the vessel to a nozzle by way of a supply line by means of the pressurized gas, and supplying the processing solution from the nozzle to a substrate, the method comprising the steps of:

(a) attaching a deaeration mechanism to the supply line, the deaeration mechanism having a gas-liquid separation membrane and a vacuum evacuation line;

(b) introducing the pressurized gas into the vessel to send out a processing solution from the vessel into one side portion of the gas-liquid separation membrane through the supply line;

(c) evacuating the other side portion of the gas-liquid separation membrane through the vacuum evacuation line to set the pressure of the other side portion of the gas-liquid separation membrane within a saturated vapor pressure of the processing solution, permitting a liquid component dissolved in the processing solution to migrate from the one side portion to the other side portion, thereby removing a gaseous component from the processing solution before the process solution is supplied to a substrate (deaeration step);

(d) discharging the processing solution present in the supply line between the deaeration mechanism and the nozzle, and introducing the processing solution deaerated in the deaeration step (c) into the supply line between the deaeration mechanism and the nozzle (processing solution replacing step);

(e) supplying the deaerated processing solution to the substrate by expelling the deaerated processing solution from the nozzle; and (f) rotating the nozzle relative to the substrate to form a liquid film of the deaerated processing solution between the nozzle and the substrate.

The resist processing method according to the present invention is a method for introducing a pressurized gas into a vessel storing a processing solution, sending the processing solution from the vessel to a nozzle by way of a supply line by means of the pressurized gas, and supplying the processing solution from the nozzle to a substrate, the resist processing method comprising the steps of:

(A) attaching a deaeration mechanism to the supply line, the deaeration mechanism having a gas-liquid separation membrane and a vacuum evacuation line;

(B) introducing a pressurized gas into the vessel to send out the processing solution from the vessel into one side portion of the gas-liquid separation membrane through the supply line;

(C) evacuating the other side portion of the gas-liquid separation membrane through the vacuum evacuation line to set the pressure of the other side portion of the gas-liquid separation membrane within a saturated vapor pressure of the processing solution, permitting a liquid component dissolved in the processing solution to migrate from the one side portion to the other side portion, thereby removing a gaseous component from the processing solution before the process solution is supplied to a substrate (deaeration step);

(D) discharging the processing solution present in the supply line between the deaeration mechanism and the nozzle, and introducing the processing solution deaerated by the deaeration step (C) into the supply line between the deaeration mechanism and the nozzle (processing solution replacing step);

(E) spinning the substrate; and (F) expelling the deaerated processing solution from the nozzle to the substrate to form a liquid film of the deaerated processing solution between the nozzle and the substrate.

The present inventors have studied causes of defects produced in developing a resist. As a result, they found that the degree of vacuum of the deaerated process atmosphere is related to the number of defects. They further found the deaeration conditions successfully reducing the number of defects.

Figure 10:
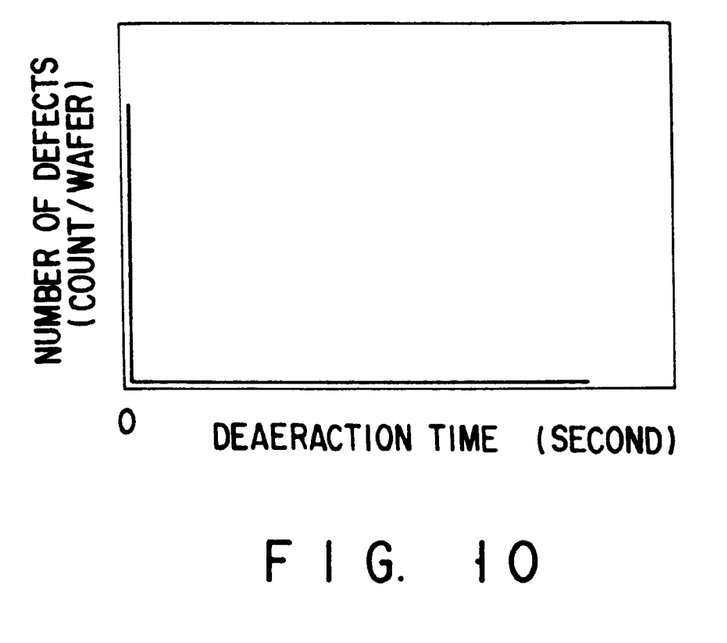
FIG. 10 is a characteristic graph showing the relationship between deaeration process time for the developing solution and the number of defects.

In the method of the present invention, a gaseous component can be removed from the developing solution by sending the developing solution without being left in the deaeration mechanism. On the other hand, if the deaeration process time is rather long, not only the gaseous component but also an active ingredient contained in the liquid are removed. As a result, the concentration of the developing solution changes as shown in FIG. 10 (exhibiting the relationship between the deaeration process time and the number of development defects). For example, when the concentration of the developing solution increases as a result of vaporization of moisture components, the resultant wiring is obtained with an excessively narrow width. This is a kind of defects. Therefore, it is desirable that the deaeration process time be shorter than 24 hours. However, the deaeration time of the developing solution needs to be longer than 10 minutes because if the deaeration time is shorter than 10 minutes, the deaeration will not be sufficiently performed.

For example, when a generally-used developing solution is deaerated, the pressure of one side portion of the gas-liquid separation membrane, (namely the inner pressure of the deaeration chamber), is preferably set at 25 to 410 Torr (−350 mmHg to −735 mmHg), and more preferably, 110 to 260 Torr (−500 mmHg to −650 mmHg). As an example of the generally-used developing solution, a 2.38%±0.01 tetramethylammonium hydroxide (referred to as "TMAH") solution may be mentioned.

Figure 11:
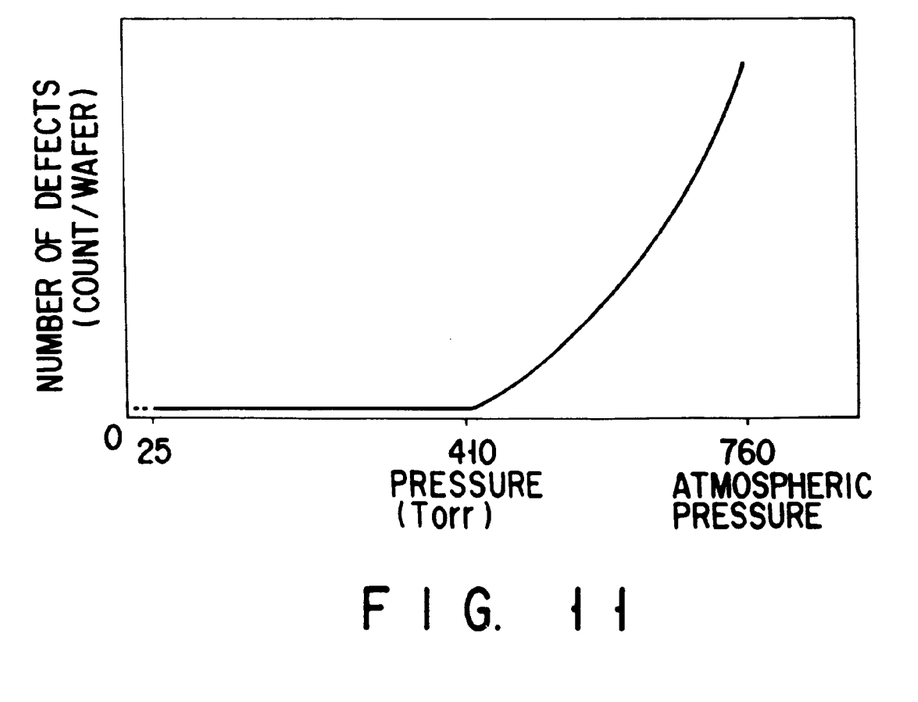
FIG. 11 is a characteristic graph showing the relationship between the degree of the reduced pressure in the deaeration apparatus and the number of defects.

As shown in FIG. 11, when the inner pressure of the deaeration chamber (pressure of one side portion of the gas-liquid separation membrane) is higher than 410 Torr (−350 mmHg), developing defects are produced. On the other hand, when the inner pressure reduces 410 Torr, no defects are produced. However, if the inner pressure is reduced in excess of 25 Torr (−735 mmHg), not only the gaseous component but also the liquid component of the developing solution permeate through the gas-liquid separation membrane. As a result, the concentration of the developing solution changes. Therefore, the uppermost inner pressure of the deaeration chamber is defined 25 Torr.

To remove various alkaline components from the developing solution without fail, it is more preferable that the inner pressure of the deaeration chamber be reduced further to the range from 110 to 260 Torr (−500 mmHg to −650 mm Hg).

The term "liquid component of the developing solution" includes a gas dissolved in the processing solution and a gas involved in the form of air bubbles.

Figure 12:
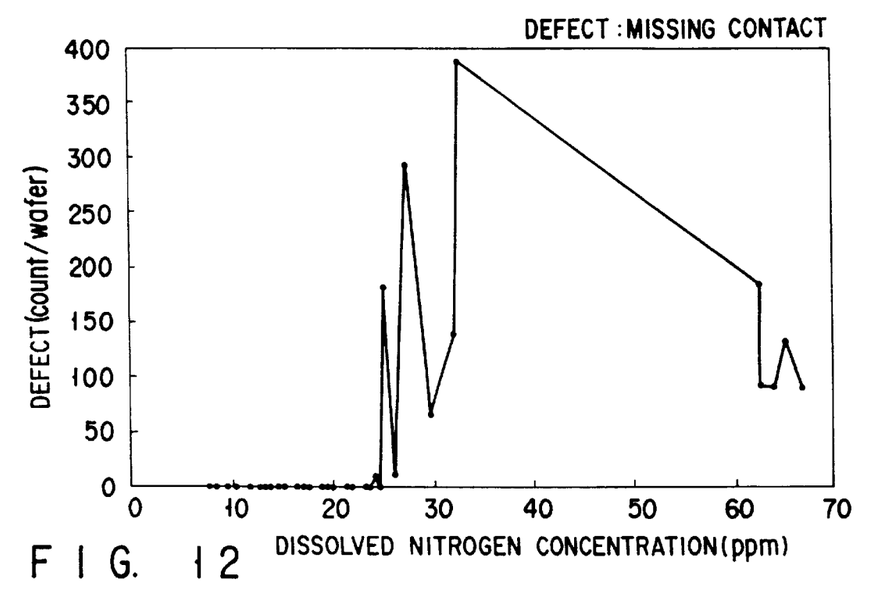
FIG. 12 is a characteristic graph showing the relationship between the dissolved nitrogen concentration of the developing solution and the number of defects.
Figure 13:
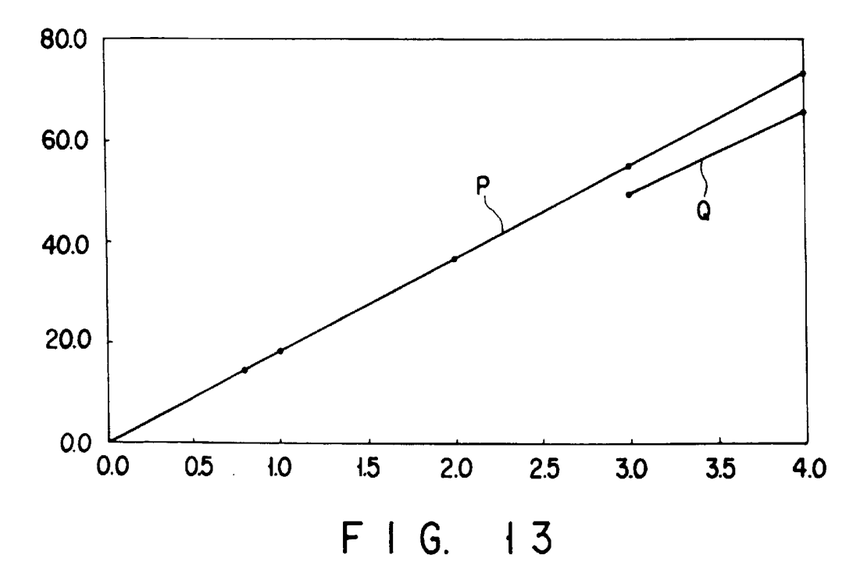
FIG. 13 is a characteristic graph showing the relationship (by theoretical values and measured values) between the dissolved nitrogen concentration of the developing solution and nitrogen gas pressure.

As shown in FIG. 12, if the concentration of dissolved nitrogen in the developing solution exceeds 25 ppm, the development defects are frequently produced. As shown in FIG. 13, a characteristic line Q of measured values approximates a characteristic line P of theoretical values. The carrier gas pressure (atm) is directly proportional to the concentration of the nitrogen dissolved in the developing solution.

The carrier gas (pressurized gas) falls preferably within the range from 0.5 to 3 kg/cm$^2$, and more preferably, from 0.5 to 1.5 kg/cm$^2$. This is because if the carrier-gas pressure exceeds 3 kg/cm$^2$, the dissolution amount of the gas in the developing solution will be excessively large and instruments attached to the developing-solution supply line will be easily broken. If the carrier gas pressure is smaller than 1.5 kg/cm$^2$, the concentration of dissolved nitrogen will be lower than 25 ppm. On the other hand, if the carrier gas pressure is lower than 0.5 kg/cm$^2$, the necessary amount of the developing solution will not be supplied. The necessary amount used herein is, for example, about 1.6 little/min. when the nozzle shown in FIGS. 5 and 6, and a wafer of 8-inch diameter are used. It should be noted that the amount of the developing solution consumed per wafer of 8-inch is from 40 to 60 cc.

The resist processing system according to the present invention comprises:

a mounting table for mounting a substrate thereon;

a nozzle for expelling a processing solution to the substrate mounted on the mounting table;

a vessel for storing the processing solution;

pressurizing means for introducing a pressurized gas into the vessel, thereby pressurizing the processing solution to send the processing solution from the vessel to the nozzle;

a processing solution supply line provided between the vessel and the nozzle, for guiding the processing solution sent out from the vessel by the pressurizing means, to the nozzle; and a deaeration mechanism attached to the processing solution supply line, for separating and removing a gaseous component from the processing solution;

the deaeration mechanism comprising an airtight chamber, a gas-liquid separation membrane provided in the airtight chamber, one side portion of which is communicated with the processing solution supply line through which the processing solution is supplied to the one side portion, a vacuum evacuation line communicated with the other side portion of the gas-liquid separation membrane, evacuation means for evacuating the other side portion of the gas-liquid separation membrane through the vacuum evacuation line, and a trap tank attached to the vacuum evacuation line, for receiving a liquid component permeating through the gas-liquid separation membrane and leaking into the vacuum evacuation line.

The trap tank preferably comprises a liquid-surface detection sensor for detecting the surface level of the liquid received therein, a pressure detection sensor for detecting the inner pressure of the tank, and a drain line for discharging the received liquid outside.

More preferably, the trap tank further comprises a pressure detection sensor for detecting the inner pressure of the deaeration chamber, and a controller for controlling the deaeration means.

The controller controls the deaeration means on the basis of the detection data obtained from the aforementioned two pressure sensors and a liquid surface detection sensor. In this mechanism, the inner pressure of the deaeration chamber is set at a saturated vapor pressure or less, thereby separating and removing the gaseous component contained in the processing solution without excessively removing the liquid component.

Furthermore, the controller is preferred to comprise a display portion for displaying the detection data and an alarm portion for giving an alarm when abnormal data (value out of the predetermined range) is presented. The alarm draws attention of a worker and let him watch the display portion, so that he knows that an abnormal change occurs in the developing solution. Hence, the abnormality can be overcome. Hence, the substrate can be processed constantly without a substantial change in the concentration of the developing solution and without process differences between substrates.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinbelow, preferable embodiments of the present invention will be explained with reference to the accompanying drawings.

First, a first embodiment of the present invention will be explained with reference to FIGS. 1 to 9.

Figure 1:
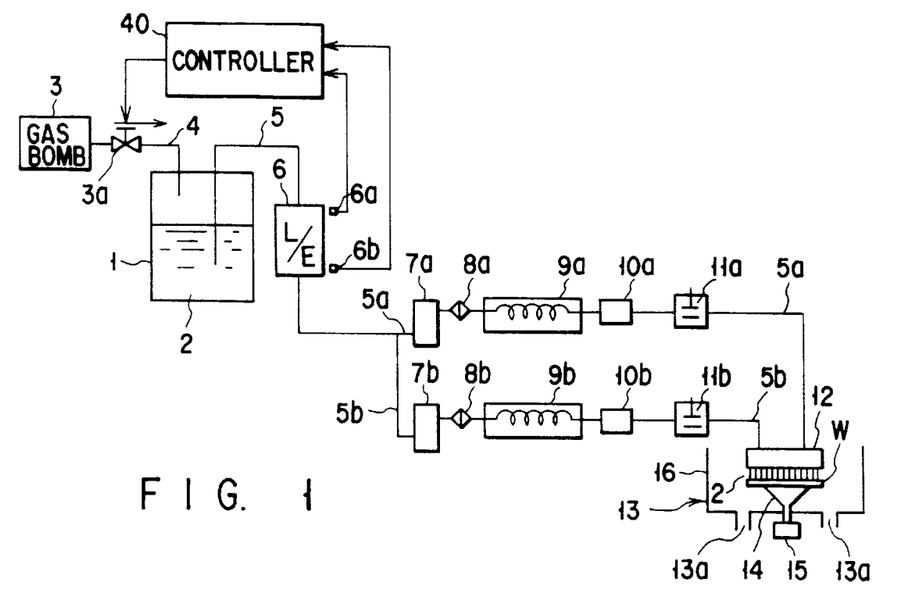
FIG. 1 is a block diagram schematically showing a resist processing system according to an embodiment of the present invention.

A developing solution 2 is stored in a main tank 1. To the main tank 1, a gas bomb 3 containing a nitrogen gas is connected via a line 4. The line 4 is provided with a pressure control valve 3a. An end portion of a line 5 is immersed in the developing solution 2 of the main tank 1. The tank 1 has an inner diameter of 20–25 cm and a height of about 50–60 cm.

The middle of the line 5 is provided with an intermediate tank 6. On the outside of the intermediate tank 6, for example, electrostatic-capacity sensors, namely a limit sensor 6a and an empty sensor 6b, are separately provided. Each of the sensors 6a and 6b is connected to an input side of a controller 40, separately. When a detection signal is input into the controller 40 from each of the sensors 6a and 6b, the controller 40 operates the pressure control valve 3a on the basis of the detection data so that the surface level of the developing solution 2 stored in the intermediate tank 6 falls within an appropriate range.

When the carrier gas (pressurized nitrogen gas) is supplied from the gas bomb 3 to the main tank 1 through the line 4, the developing solution 2 is pressurized and sent out to a nozzle 12 through lines 5, 5a and 5b. It is preferable that the pressure of the carrier gas fall within the range of 0.5 to 3 kg/cm$^2$.

The line 5 is branched downstream of the intermediate tank 6 into two lines 5a and 5b and merges at a nozzle 12. The first branched line 5a is provided with a flow meter 7a, a filter 8a, a water jacket 9a, a developing-solution deaeration apparatus 10a, and an air-operation valve 11a in that order from the upstream end. The second branched line 5b is provided with a flow meter 7b, a filter 8b, a water jacket 9b, a developing-solution deaeration apparatus 10b, and an air-operation valve 11b in that order from the upstream end. The filters 8a and 8b are desirably provided at lines 5a and 5b as far upstream as possible. This is because if the filters 8a and 8b are close to the nozzle 12, leakage of the developing solution occurs at the nozzle 12 due to pulse movement. The water jackets 9a and 9b may be positioned interchangeably with the developing solution deaeration apparatuses 10a and 10b. The developing-solution deaeration apparatuses 10a and 10b are connected to a controller 40. The controller 40 controls the operation of the developing-solution deaeration apparatuses 10a and 10b to sufficiently remove the gaseous component from the developing solution without significantly changing the concentration of the developing solution 2.

The developing process portion 13 comprises a spin chuck 14, a motor 15 and a cup 16. The spin chuck 14 is variably rotated by a motor 15 and has a vacuum adsorption mechanism (not shown) for holding a wafer W by adsorption. The cup 16 houses the spin chuck 14 and has a drain passage 13a for discharging waste liquid, such as used developing solution.

During the passage of the developing solution 2 through the branched lines 5a and 5b, impurities and foreign matters are removed by the filters 8a and 8b, while the flow rate of the developing solution 2 is controlled by the flow-meters 7a and 7b. Since temperature-controlled water is circulated through the water jackets 9a and 9b, the temperature of the developing solution 2 passing through the branched lines 5a and 5b is controlled. After the temperature is adjusted, the developing solutions 2 is introduced into the developing-solution deaeration apparatuses (deaeration mechanism) 10a and 10b, to remove a gaseous component. The deaeration is preferably performed under a pressure ranging from 25–410 Torr (−350 mmHg to −735 mmHg), and more preferably, from 110–260 Torr (−500 mmHg to −650 mmHg). The deaerated developing solution 2 is supplied onto the wafer W mounted on the chuck 14 through the nozzle 12. Hence, the coated resist is developed uniformly without defects.

Figure 2:
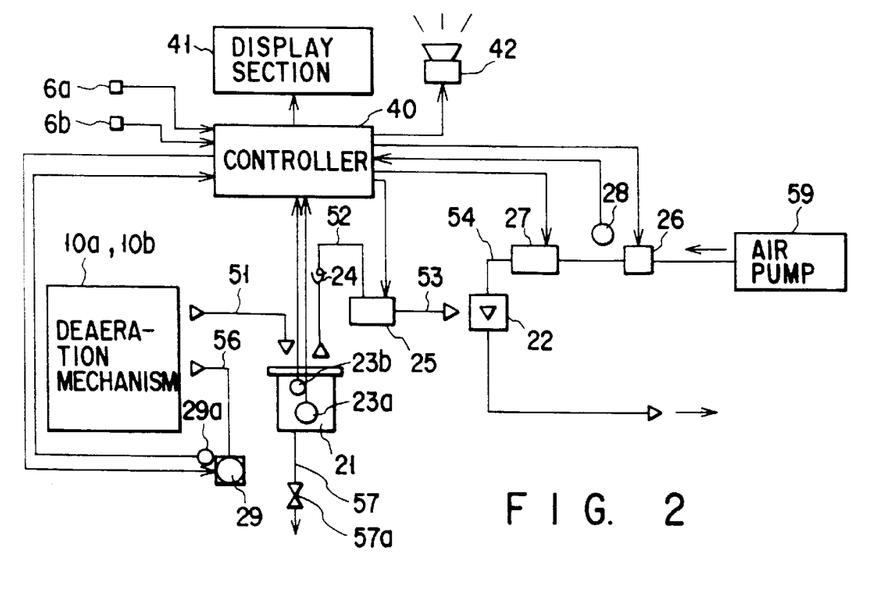
FIG. 2 is a block diagram showing a deaeration apparatus for the developing solution used in the resist processing system.
Figure 3:
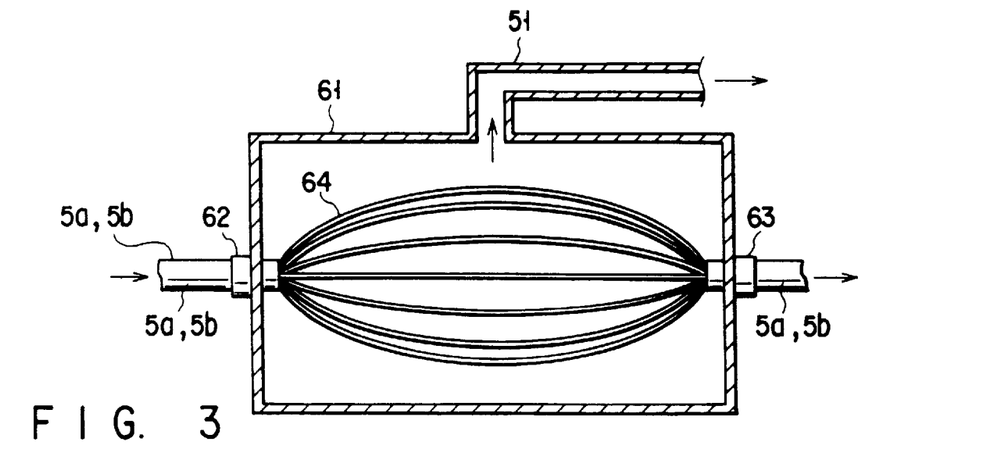
FIG. 3 is a perspective cross-sectional view schematically showing a deaeration mechanism.
Figure 4:
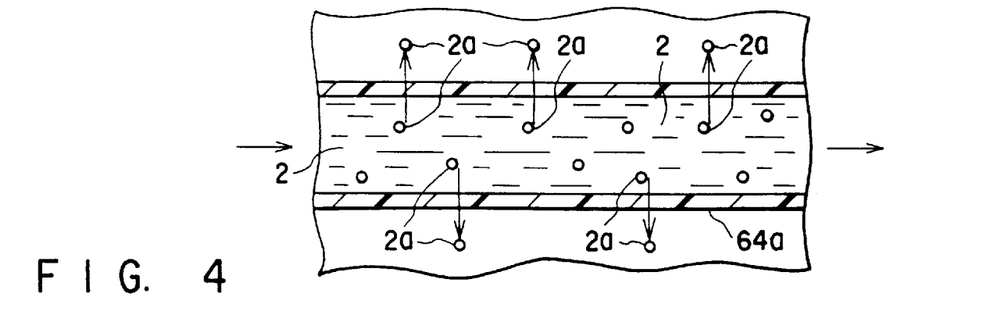
FIG. 4 is a magnified view schematically showing a gas-liquid separation element of the deaeration mechanism for explaining a deaeration function.

Next, we will explain a vacuum circuit provided in the developing-solution deaeration apparatuses 10a and 10b with reference to FIGS. 2 to 4. Since the first deaeration apparatus 10a is substantially the same as the second deaeration apparatus 10b, only the first deaeration apparatus 10a will be explained below. Explanation of the second deaeration apparatus 10b will be omitted.

As shown in FIG. 2, vacuum evacuation lines 51, 52, 53 and 54 of the developing-solution deaeration apparatus 10a (10b) are provided with a trap tank 21 and an ejector 22. The trap tank 21 is communicated with the airtight vessel 61 of the developing-solution deaeration apparatus 10a (10b) through a line 51. The trap tank 21 is a vessel for receiving the developing solution 2 leaking from the developing-solution deaeration apparatus 10a through the line 51 during the deaeration operation. The bottom of the trap tank 21 is provided with a drain line 57.

The trap tank 21 is provided with a liquid-surface detection sensor 23a and a pressure sensor 23b. The liquid-surface detection sensor 23a is used for detecting the surface level of the developing solution trapped in the tank 21. The pressure sensor 23b is used for detecting the liquid contained in the tank 21. These sensors 23a and 23b are separately connected on the input side of the controller 40.

The trap tank 21 is communicated with the ejector 22 through the line 52. The line 52 is provided with a stop valve 24 and a solenoid valve 25 in that order when viewed from the side of the trap tank 21. The ejector 22 is provided with a line 54 which serves for a different system from the system involving the trap tank 21. The line 54 is communicated with an air pump 59. The line 54 is provided with a regulator 26 for controlling a flow rate of a supplied air, and a solenoid valve 27. When air is supplied to the line 54 from the pump 59, the pressures of the airtight vessel 61 and the trap tank 21 are reduced by the air flow thus produced.

A gauge 28 is provided between the regulator 26 and the solenoid valve 27. The gauge 28 is connected to the input side of the controller 40.

As shown in FIG. 3, the developing-solution deaeration apparatus 10a comprises an airtight vessel (deaeration chamber) 61, an inlet 62, an outlet 63, and a gas-liquid separation element 64. The developing-solution deaeration apparatuses 10a and 10b are substantially the same as that disclosed in the U.S. patent application Ser. No. 08/579,845 filed Dec. 26, 1995, now U.S. Pat. No. 6,033,475. To the upper portion of the deaeration chamber 61, a vacuum evacuation line 51 is connected to evacuate the chamber 61. The inlet 62 and the outlet 63 are connected to developing solution supply lines 5a (5b).

The chamber 61 of each of the developing solution deaeration apparatuses 10a and 10b is provided with a vacuum switch 29. The vacuum switch 29 is provided with a gauge 29a. The gauge 29a is connected to the input side of the controller 40.

The controller 40 has two output portions which are connected to a display section 41 and an alarm unit 42, separately. When the detection data obtained by sensors (6a, 6b, 23a, 23b, 28, 29a) indicate abnormal values, the controller 40 directs the display section 41 to indicate the abnormal state and direct the alarm unit 42 to give an alarm. As the same time, it controls the operation of a regulator 26 and solenoid valves 25 and 27, individually.

A gas-liquid separation element 64 is provided between the inlet 62 and the outlet 63. The developing solution 2 is introduced into the gas-liquid separation element 64 from the inlet 62 through the line 5a (5b). The developing solution 2 passes through the gas-liquid separation element 64, goes out from the outlet 63, and is supplied to the nozzle 12 through lines 5a (5b).

The gas-liquid separation element 64 is formed of a bundle of capillaries made of a porous film, non-porous film, and a composite film. As the porous film, a porous thin film made of polytetrafluoroethylene (PTFE) or a polyolefin-series resin is used. As the non-porous film, a non-porous thin film made of a tetrafluoroethylene.hexafluoropropylene copolymer (FEP), a tetrafluoroethylene.perfluoroalkylvinyl ether copolymer (PFA), or polytetrafluoroethylene (PTFE) is used. The composite film is a film formed by combining the porous film and the non-porous film.

As shown in FIG. 4, the membrane 64a of the gas-liquid separation element 64 has a function of permeating only gaseous component 2a contained in the developing solution 2. Examples of the gaseous component 2a permeable through the membrane 64a include a nitrogen gas molecule, oxygen gas molecule, hydrogen gas molecule, dioxide gas molecular, argon gas molecule, and the like.

Figure 5:
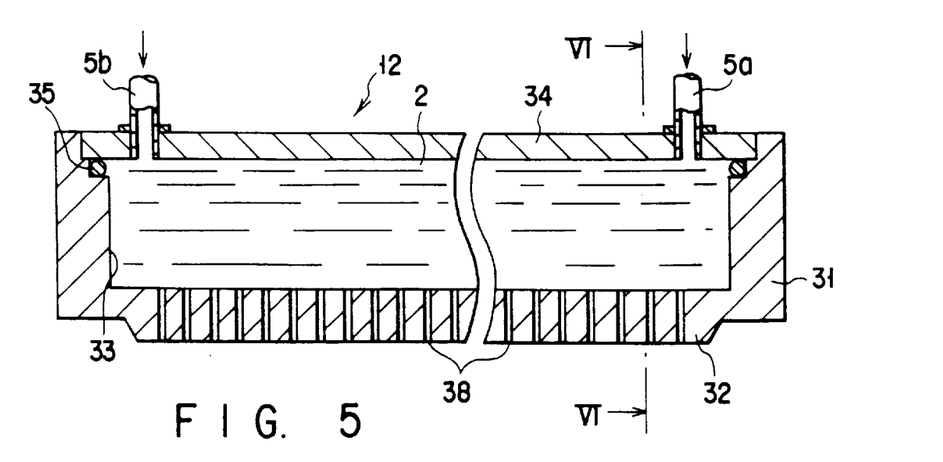
FIG. 5 is a cross-sectional view of a nozzle.
Figure 6:
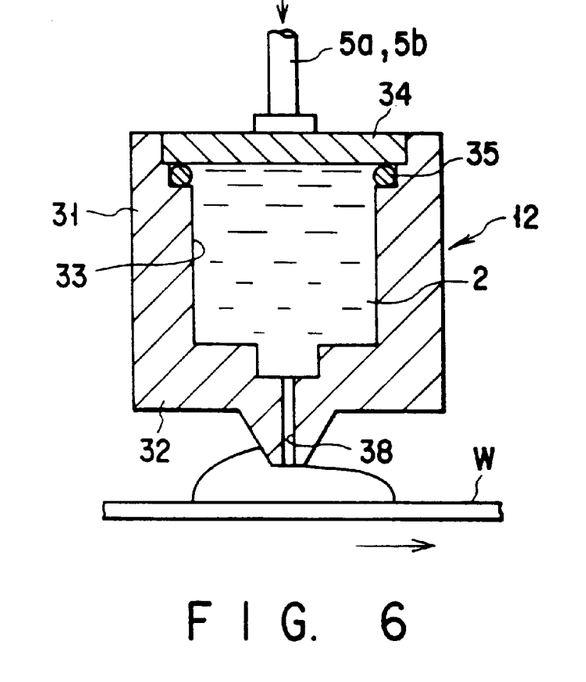
FIG. 6 is an orthogonal cross-sectional view of a nozzle taken along a VI—VI line.

Now, the nozzle 12 will be explained with reference to FIGS. 5 and 6.

The nozzle 12 has a developing-solution storing chamber 33 defined by a side wall 31 and a bottom wall 32. An upper opening of the storing chamber 33 is blocked with a covering member 34. The portion between the covering member 34 and the side wall 31 is sealed with a packing 35. Two developing solution supply pipes 37 are provided separately to the covering member 34. The developing solution 2 sent through the lines 5a and 5b is supplied to the developing-solution storing chamber 33 (through two supply pipes 37) and stored therein. In the bottom wall 32, a plurality of liquid expelling holes 38 are formed in the longitudinal direction. The developing solution 2 is supplied from the liquid expelling hole 38 onto the wafer W. The horizontal length of the nozzle 12 is almost equal to the diameter of the wafer W.

Figure 8:
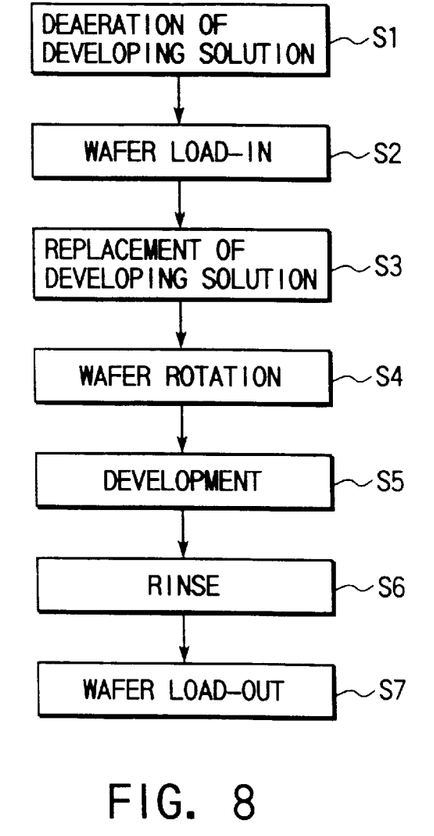
FIG. 8 is a flow-chart showing steps of developing the semiconductor wafer.

Next, a developing process of the wafer W will be explained with reference to FIG. 8.

To supply the developing solution 2 to the wafer W from the nozzle 12, the practical operation procedure is as follows: First, a $N_2$ gas serving as a pressurized gas is introduced into the tank 1 through the line 4. The developing solution 2 stored in the tank 1 is sent out to the supply line. During this operation, air-operation valves 11a and 11b are closed.

When the developing solution 2 is supplied to the developing-solution deaeration apparatuses 10a and 10b, the deaeration of the developing solution 2 is performed at a pressure ranging from 110 to 260 Torr (−500 mmHg to −650 mmHg) just for about 240 seconds (step S1). Details on the deaeration process S1 will be described later with reference to the flow-chart shown in FIG. 9.

A resist is coated onto the wafer W in a resist coating apparatus (not shown). The coated resist is exposed to light in the light-exposure apparatus (not shown). Subsequently, the wafer is loaded into the developing unit and mounted on the spin-chuck 14 (step S2).

Then, the air operation valves 11a and 11b are opened. After the developing solution 2, present in the supply lines 5a and 5b between the developing-solution deaeration apparatuses 10a and 10b and the nozzle, is completely discharged, the deaerated developing solution is newly supplied from the developing-solution deaeration apparatuses 10a and 10b to the supply lines 5a and 5b. In this way, the developing solution to be expelled to the substrate W from the nozzle 12, is replaced with the deaerated developing solution (Step S 3). For example, assuming that 1 cc of the developing solution 2 is left in the lines (5a, 5b) between the developing-solution deaeration apparatuses (10a, 10b) and the air-operation valves (11a, 11b), 1 cc in the air operation valves (11a, 11b), 18 cc in the lines (5a, 5b) between the air operation valves (11a, 11b) and the nozzle 12, and 80 cc in the nozzle 12, the total amount of 100 cc (sum of the developing solution in lines 5a and 5b) is dispensed (referred to as "dummy-dispense"). Instead, the deaerated developing solution is supplied to the lines 5a and 5b as well as to the nozzle 12. Thereafter, the air operation valves 11a and 11b are closed.

Figure 7:
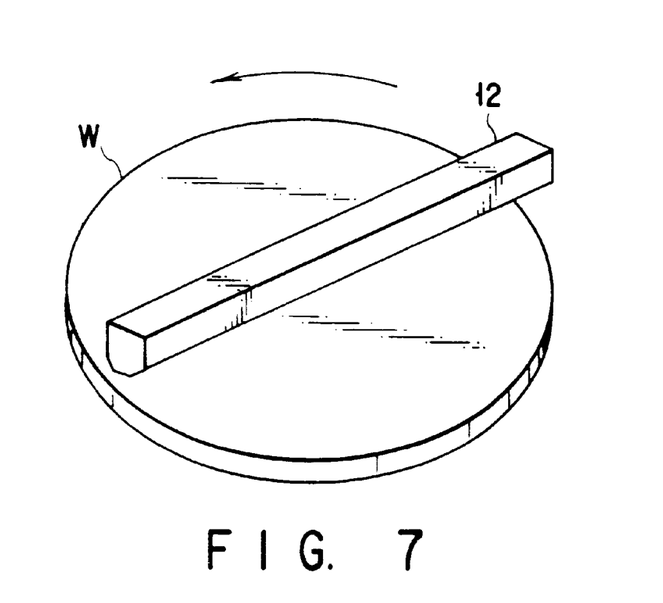
FIG. 7 is a schematical perspective view of a nozzle and a semiconductor wafer.

Subsequently, as shown in FIG. 7, the nozzle 12 is positioned above in the center of the wafer W. Then, the nozzle 12 is positioned as shown in FIG. 6 by moving up and down relative to the wafer. Thereafter, air operation valves (11a, 11b) are opened to allow the deaerated developing solution to expel from the liquid expelling hole 38. In this manner, the liquid film of the deaerated developing solution is formed between the wafer W surface and the nozzle 12. It is preferred that the expelling amount of the developing solution be smaller than the deaerated developing solution. Conversely, the amount of the developing solution is preferably larger than the expelling amount per time unit (amount per wafer).

While this state is being maintained, the wafer W is rotated by 180° by means of the motor 15 (Step, S4). The developing solution is spread by the rotation of the wafer W, forming a liquid film of the deaerated developing solution on the surface of the wafer W. The deaerated developing solution is delivered uniformly over the resist film which has been formed on the wafer W. Then, the air-operation valves (11a, 11b) are closed. Since the coated resist is sufficiently exposed to the deaerated developing solution, the coated resist is uniformly developed (Step, S5). In the developing step S5, since deaeration is performed under conditions in which the concentration of the developing solution is not significantly changed, development defects do not occur.

In the development step S5, it is preferred that the dummy dispense be preferably performed before initiation of the processing and at predetermined intervals (30 minutes) for cleaning the supply lines (5, 5a, 5b). To attain the cleaning effectively, the amount of the dummy dispense is preferably 100–200 cc, which is larger than the expelling amount per time. For example, in this embodiment, the amount of the dummy dispense is set to 150 cc, which corresponding to an overall amount of the expelling amount (50 cc) at normal operation and a deaeration amount (100 cc).

After completion of the development, the wafer W is rinsed with pure water while being rotated at high speed (Step, S6). After rinse, the wafer W is unloaded from the developing unit (Step, S7).

Figure 9:
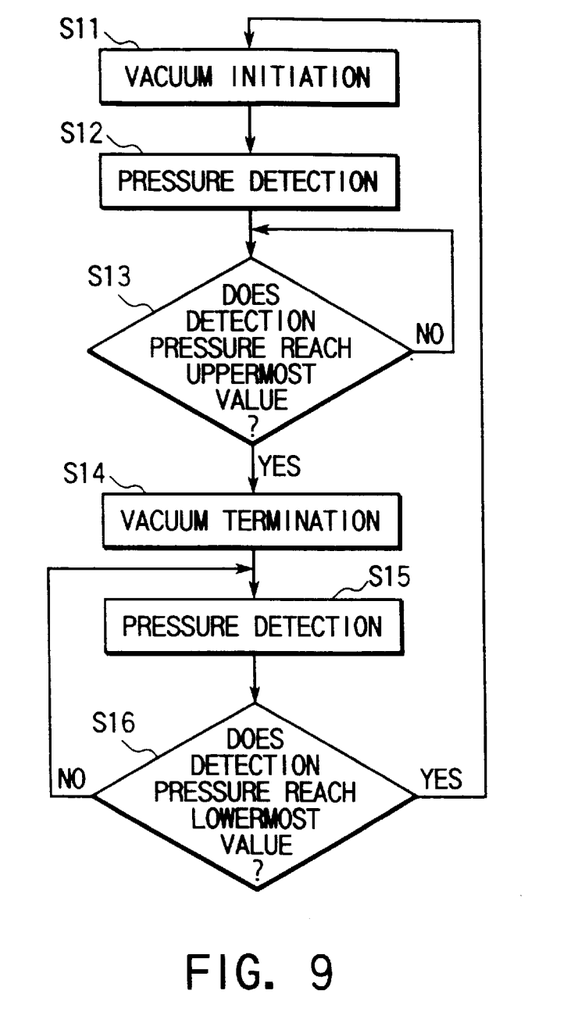
FIG. 9 is a flow-chart showing a deaeration method of the developing solution.

The deaeration operation of the developing solution will now be explained with reference to FIG. 9.

(1) In normal operation, the solenoid valve 25 of the controller 40 is left open. While this condition is being maintained, the controller 40 opens the solenoid valve 27, thereby supplying air to the line 54 to drive the ejector 22. In this manner, vacuum operation of the chamber 61 is initiated (Step, S11). The chamber 61 is evacuated through the lines 51, 52, and 53 by the operation of the ejector 22. The inner pressure of the chamber 61 is reduced. The inner pressures of the chamber 61 and the trap tank 21 are separately detected (Step, S12). The controller 40 receives the pressure detection data from the sensors (23b, 28, 29a). The controller 40 controls the operation valves (11a, 11b), the solenoid valves (25, 27), a generator (regulator) 26, and the vacuum switch 29 on the data thus obtained, thereby setting the inner pressures of the deaeration chamber 61 and trap tank 21 within the range of 110 to 260 Torr. This vacuum operation is continued until the pressure gauge 29a of the vacuum switch 29 reaches the uppermost value, −650 mmHg (110 Torr) (Step, S13).

(2) When the pressure gauge 29a displays the uppermost value, the solenoid valve 27 is closed to stop air supply to the ejector 22 by the controller 40. The vacuum operation of deaeration chamber 61 is terminated (Step, S14).

(3) As the deaeration of the developing solution proceeds in the chamber 61, the value displayed by the gauge 29a of the vacuum switch 29 gradually increases. The inner pressures of the deaeration chamber 61 and the trap tank 21 are separately detected (Step, S15). The vacuum (deaeration) is continued until the display of the pressure gauge 29a of the vacuum switch 29 reaches the lowermost value, −500 mmHg (260 Torr) (Step, S16).

When the pressure gauge 29a displays the lowermost value, the controller 40 opens the solenoid valve 27 to drive the ejector 22 again. The operation of the ejector 22 is continued until the gauge 29a of the vacuum switch 29 reaches the uppermost value, −650 mmHg (110 Torr) (Step, S11).

(4) Thereafter, the procedures (2) and (3) are repeated.

If the deaeration of the developing solution is repeated in this way, a small amount of the liquid component permeates through the membrane of the gas-liquid separation element 64a and leaks into the vacuum evacuation line 51. However, the leaked liquid containing a liquid component is received by the trap tank 21, so that the lines 52, 53, and 54 located downstream of the tank 21 are not contaminated with the leaked liquid component. The liquid component leakage is accumulated in the trap tank 21 and the liquid surface increases. The controller 40 monitors the surface level of the liquid in the trap tank 21 by use of the liquid surface detecting sensor 23. When the liquid surface reaches a preset level, the controller 40 closes the solenoid value 25, thereby terminating the vacuum operation of the chamber 61 through lines 51 to 53. Subsequently, the controller 40 opens a valve 57a to discharge the liquid of the trap tank 21 to the drain line 57. The controller 40 further opens the solenoid valves 25 and 27 to drive the ejector 22. In this way, the deaeration of the developing solution is started again.

Since the vacuum evacuation line 51 is communicated with the drain line 57 of the trap tank 21, leakage of the liquid component can be discharged from the trap tank 21 through the drain line 57. Therefore, even if TMAH (tetramethylammonium hydroxide) acting as an active agent of the developing solution leaks in the vacuum evacuation line 51, the leakage will not affect the vacuum evacuating means (22, 26, 27, 28, 59). The evacuation capacity will not decrease.

Figure 14:
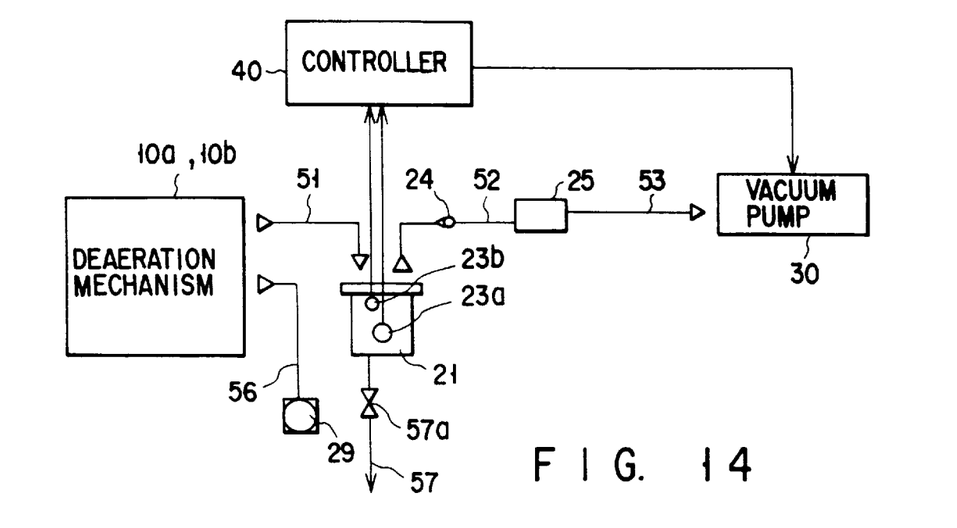
FIG. 14 is a block diagram showing a deaeration apparatus for a processing solution (developing solution) according to another embodiment.

Next, the deaeration apparatus of another embodiment will be explained with reference to FIG. 14. Like reference numerals are used to designate like structural elements corresponding to the aforementioned embodiment and any further explanation is omitted for brevity's sake.

In the deaeration apparatus, the vacuum evacuation line 53 positioned downstream of the deaeration apparatus is connected directly to a suction side of a vacuum pump 30. Since the chamber 61 is evacuated directly by the vacuum pump 30 via the vacuum evacuation lines (51 to 53) in the deaeration apparatus, the evacuation capacity will increase. Furthermore, the since the deaeration apparatus is equipped with the trap tank 21 for preventing the vacuum pump 30 from sucking the liquid component leakage, the evacuation capacity will not decrease.

The operation of deaerating the developing solution by use of the deaeration mechanism is as follows:

(1) In normal operation, the controller 40 keeps the solenoid valve 25 open. While this condition is being maintained, a vacuum pump 30 is driven by the controller 40. In this way, the vacuum operation of the deaeration chamber 61 is initiated (Step, S11). The deaeration chamber 61 is evacuated by the operation of the vacuum pump 30 through lines 51, 52, and 53. The inner pressure of the chamber 61 is reduced.

The inner pressures of the deaeration chamber 61 and the trap tank 21 are separately detected (Step, S12). When the controller 40 receives the pressure detection data from the sensors 23b, 28 and 29a, it controls the inner pressures of the deaeration chamber 61 and the trap tank 21 by use of the operation valves (11a, 11b), the solenoid valve 25, and vacuum switch 29 so that they fall within the range of 25 to 410 Torr. The vacuum operation is continued until the pressure gauge 29a of the vacuum switch 29 reaches the uppermost value, −735 mmHg (25 Torr) (Step S13).

(2) When the pressure gauge 29a displays the uppermost value, the controller 40 stops the operation of the vacuum pump 30. In this manner, the vacuum operation of the deaeration chamber 61 is terminated (Step, S14).

(3) As the deaeration of the developing solution proceeds in the chamber, the value displayed by the gauge 29a of the vacuum switch 29 gradually increases. The inner pressures of the deaeration chamber 61 and the trap tank 21 are separately detected (Step, S15). The vacuum operation is continued until the pressure gauge 29a of the vacuum switch 29 reaches the lowermost value, −350 mmHg (410 Torr) (Step, S16).

When the pressure gauge 29a displays the lowermost value, the controller 40 drives the vacuum pump 30 again. The operation of the vacuum pump 30 is continued until the gauge 29a of the vacuum switch 29 reaches the uppermost value, −735 mmHg (25 Torr) (Step, S11).

(4) Thereafter, the aforementioned procedures (2) and (3) are repeated.

In the deaeration mechanism of this embodiment, a high level of vacuum is attained which achieves effective deaeration. Consequently, the gaseous component contained in the developing solution can be sufficiently removed.

High-resolution resists coated on 8-inch wafers W were actually developed by using the developing solution deaerated by the method of the present invention, and the developing solution deaerated by a conventional method. Both the resists were compared for development defects. The former resist improves on the latter by 70% or more, with respect to the defects.

As the developing solution expelling nozzle, a stream type nozzle 81 (shown in FIG. 15) or a multi-type nozzle 82 (shown in FIG. 16) formed of a main nozzle provided with a plurality of nozzles 83 may be used. The nozzles 81 and 82 are moved from one side portion to the other side in a scanning fashion while the wafer W is being rotated.

Figure 15:
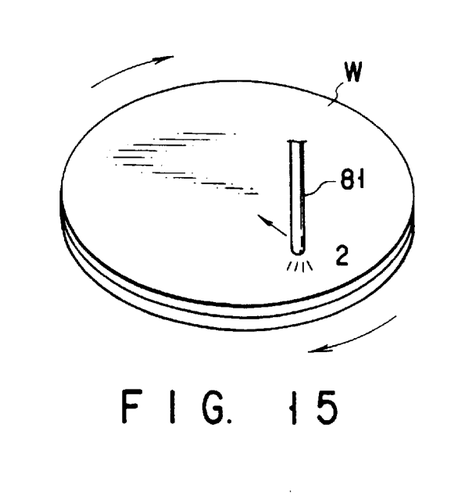
FIG. 15 is a schematical perspective view of a nozzle according to another embodiment.
Figure 16:
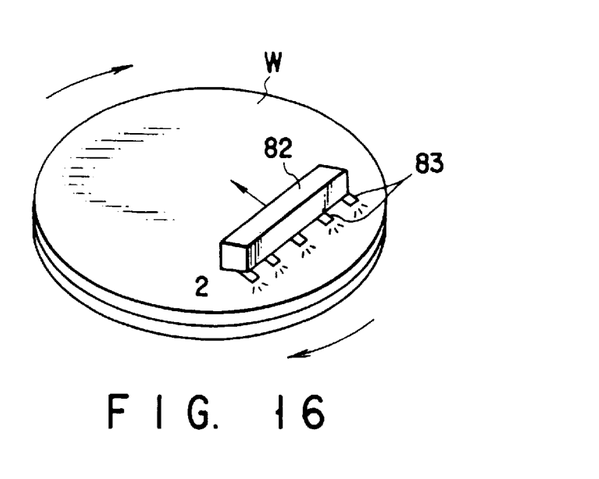
FIG. 16 is a schematical perspective view of a nozzle according to a further embodiment.

In practice, the developing solution 2 is supplied to the wafer W by the stream type nozzle 81 and the multi-type nozzle 82 as follows: First, a $N_2$ gas is introduced into the tank 1 through the line 4, thereby sending out the developing solution 2 from the tank 1 to the supply line 5. Thereafter, both operation valves 11a and 11b are closed.

Subsequently, the developing solution 2 is deaerated in the developing-solution deaeration apparatuses 10a and 10b at a saturated vapor pressure or less, for example, 25–410 Torr (−350 mmHg to −735 mmHg) for just 240 seconds.

After the developing solution present in the supply lines 5a and 5b is discharged, the deaerated developing solution is newly supplied in place of the discharged solution. The replacement of the developing solution is made by the dummy-dispense of the developing solution (which is attained by opening the air-operation valves 11a and 11b) present in the supply lines (5a, 5b) between the developing-solution deaeration apparatuses (10a, 10b) and a nozzle (81 or 82). The air operation valves 11a and 11b are closed.

Then, the nozzle (81 or 82) is positioned at a distance from the wafer W. After the air operation valves 11a and 11b are opened, the developing solution is expelled from the nozzle (81 or 82) onto the center of the wafer. The wafer W is allowed to rotate while the developing solution is expelled out. The nozzle (81 or 82) is reciprocally moved relative to the wafer W. It is preferable that the expelling amount of the developing solution be smaller than that of the deaerated solution. Conversely, the amount of the developing solution to be deaerated is preferably larger than the expelling amount per time unit.

Thereafter, the air operation valves (11a, 11b) are closed. In this manner, the coated resist is developed with the deaerated developing solution.

In the aforementioned embodiments, a semiconductor wafer is used. However, the present invention is not limited to the semiconductor wafer and an LCD substrate may also be used.

As explained above, the resist processing method of the present invention is one performed by supplying a processing solution on the surface of a substrate. Since the process solution employed in the present invention is deaerated within a saturated pressure of the processing solution for at least 15 seconds, the gaseous component contained in the processing solution can be sufficiently removed. Hence, the resist can be processed without defects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A resist processing system comprising:
   a mounting table for mounting a substrate thereon;
   a nozzle for expelling out a processing solution to the substrate mounted on the mounting table;
   a vessel for storing the processing solution;
   pressurizing means for introducing a pressurized gas into the vessel, thereby pressurizing the processing solution to send the processing solution from the vessel to the nozzle;
   a processing solution supply line provided between the vessel and the nozzle, for guiding the processing solution sent out from the vessel by said pressurizing means, to the nozzle; and
   a deaeration mechanism attached to said processing solution supply line, for separating and removing a gaseous component from the processing solution;
   said deaeration mechanism comprising
   an airtight chamber,
   a gas-liquid separation membrane provided in the airtight chamber, one side portion of which is communicated with said processing solution supply line through which said processing solution is supplied to said one side portion,
   a vacuum evacuation line communicated with the other side portion of the gas-liquid separation membrane,
   evacuation means for evacuating the other side portion of the gas-liquid separation membrane through the vacuum evacuation line, and
   a trap tank attached to the vacuum evacuation line, for receiving a liquid component permeating through the gas-liquid separation membrane and leaking into the vacuum evacuation line.

2. A system according to claim 1, wherein said evacuation means comprises
   an ejector main body communicated with the vacuum evacuation line,
   another line communicated with the ejector main body, and
   fluid supply means for sending a fluid to said another line, thereby reducing pressure of the vacuum evacuation line.

3. The system according to claim 1, wherein said evacuation means is a vacuum pump which is communicated directly with the vacuum evacuation line, for reducing pressure in the vacuum evacuation line.

4. The system according to claim 1, further comprising an intermediate tank attached to the processing solution supply line between said vessel and the deaeration mechanism, for temporarily storing the processing solution before the solution is supplied to the deaeration mechanism.

5. The system according to claim 1, wherein said vacuum evacuation line has a stop valve, a first solenoid valve, an ejector, a regulator, a gauge, and a second solenoid valve.

6. The system according to claim 1, wherein said processing solution supply line is branched, each branched line being communicated with the nozzle.

7. The system according to claim 1, wherein said gas-liquid separation membrane is constituted of a plurality of capillaries made of any one of a porous film, a non-porous film, and a composite film.

8. The system according to claim 7, wherein said porous film is a porous thin film made of polytetrafluoroethylene (PTFE) or a polyolefin-series resin; said non-porous film is a non-porous thin film made of a tetrafluoroethylene-.hexafluoropropylene copolymer (FEP), a tetrafluoroethylene.perfluoroalkylvinyl ether copolymer (PFA), or polytetrafluoroethylene (PTFE); and said composite film is a composite film made by combining the porous film and the non-porous film.

9. The system according to claim 4, further comprising:

a controller for controlling the pressurizing means and the evacuation means;

a first sensor connected to an input terminal of the controller, for detecting a surface level of the processing solution contained in the intermediate tank;

a second sensor connected to the input terminal of the controller, for detecting a surface level of the liquid component contained in the trap tank; and a third sensor connected to the input terminal of the controller, for detecting an inner pressure of the trap tank;

wherein said controller controls the pressurizing means on the basis of a detection signal output from the first sensor and further controls the evaluation means on the basis of detection signals output from the second and third sensors.

10. The system according to claim 9, further comprising:

a display portion connected to an output terminal of the controller, for displaying data obtained from at least one of the detection signals output from the first, second and third sensors; and an alarm portion connected to the output terminal of the controller, for giving an alarm when one of the detection signals of the first, second and third sensors indicates an abnormal condition.

* * * * *

UNITED STATES PATENT AND TRADEMARK OFFICE
CERTIFICATE OF CORRECTION

PATENT NO. : 6,217,657 B1  Page 1 of 1
DATED : April 17, 2001
INVENTOR(S) : Kiba et al.

It is certified that error appears in the above-identified patent and that said Letters Patent is hereby corrected as shown below:

<u>Title page,</u>
Item [75], Inventors, should read:
-- [75]  Inventors:  Yukio Kiba, Kikuchi; Norio Semba, Kumamoto; Keize Hasebe, Kofu, all of (JP) --

Signed and Sealed this

Eighteenth Day of May, 2004

JON W. DUDAS
*Acting Director of the United States Patent and Trademark Office*